United States Patent
Ikedo et al.

(10) Patent No.: US 9,277,151 B2
(45) Date of Patent: Mar. 1, 2016

(54) SOLID-STATE IMAGE SENSOR WITH AN EFFECTIVE PIXEL AREA, AND IMAGE PICKUP APPARATUS

(71) Applicant: CANON KABUSHIKI KAISHA, Tokyo (JP)

(72) Inventors: Hideki Ikedo, Kawasaki (JP); Keiji Nagata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/922,806

(22) Filed: Jun. 20, 2013

(65) Prior Publication Data

US 2014/0002702 A1    Jan. 2, 2014

(30) Foreign Application Priority Data

Jun. 29, 2012  (JP) .................................. 2012-147594
Apr. 16, 2013  (JP) .................................. 2013-086062

(51) Int. Cl.
- H04N 5/374  (2011.01)
- H01L 27/146  (2006.01)
- H04N 5/359  (2011.01)
- H04N 5/3745  (2011.01)

(52) U.S. Cl.
CPC .......... *H04N 5/374* (2013.01); *H01L 27/14603* (2013.01); *H01L 27/14612* (2013.01); *H01L 27/14623* (2013.01); *H04N 5/359* (2013.01); *H04N 5/37452* (2013.01)

(58) Field of Classification Search
CPC ........ H04N 5/335; H04N 5/378; H04N 3/155
USPC .................................. 348/294, 302, 307, 308
See application file for complete search history.

(56) References Cited

U.S. PATENT DOCUMENTS

| | | | |
|---|---|---|---|
| 2009/0278031 A1* | 11/2009 | Kitano et al. .............. | 250/208.1 |
| 2011/0101420 A1* | 5/2011 | Patel ............................. | 257/225 |
| 2012/0153125 A1* | 6/2012 | Oike et al. ................. | 250/208.1 |
| 2012/0273657 A1* | 11/2012 | Kobayashi ................. | 250/208.1 |

FOREIGN PATENT DOCUMENTS

| | | | | |
|---|---|---|---|---|
| JP | 2004-111590 A | | 4/2004 | |
| JP | 2006-246450 A | | 9/2006 | |
| JP | 2010-021450 A | | 1/2010 | |
| JP | 2010021450 | * | 1/2010 | ............ H01L 27/146 |

* cited by examiner

*Primary Examiner* — Gevell Selby
(74) *Attorney, Agent, or Firm* — Cowan, Liebowitz & Latman, P.C.

(57) ABSTRACT

A solid-state image sensor including an effective pixel area in which a plurality of pixels are two-dimensionally arranged, each of the plurality of pixels comprising a photoelectric conversion portion configured to generate charges by photoelectric conversion, a charge holding portion configured to hold the charges generated by the photoelectric conversion portion, a floating diffusion portion configured to convert the charges from the charge holding portion into a voltage, a first transfer portion configured to transfer the charges of the photoelectric conversion portion to the charge holding portion, and a second transfer portion configured to transfer the charges of the charge holding portion to the floating diffusion portion, wherein the charge holding portion of each of the plurality of pixels is arranged on the inner side of the photoelectric conversion portion with respect to the center of the effective pixel area.

14 Claims, 10 Drawing Sheets

SOLID-STATE IMAGE SENSOR WITH AN EFFECTIVE PIXEL AREA, AND IMAGE PICKUP APPARATUS

BACKGROUND OF THE INVENTION

1. Field of the Invention

The present invention relates to a solid-state image sensor and an image pickup apparatus.

2. Description of the Related Art

A CMOS solid-state image sensor has been widely used for an image pickup apparatus such as a digital still camera or digital video camera. In recent years, there has been proposed a configuration for implementing a global shutter function of making the accumulation times of respective pixels of a CMOS solid-state image sensor equal to each other (performing exposure for the same time).

In a configuration described in Japanese Patent Laid-Open No. 2004-111590, for example, a charge holding portion for holding signal charges generated by the photoelectric conversion portion of each pixel is provided for each pixel. In this configuration, the photoelectric conversion portions of all the pixels simultaneously start exposure and accumulation. Upon completion of accumulation, the signal charges of the photoelectric conversion portions of all the pixels are simultaneously transferred to the corresponding charge holding portions, respectively. It is possible to obtain an image pickup signal, for which the accumulation periods of all the pixels are equal to each other, by sequentially reading out pixel signals based on the signal charges held in the charge holding portions from a common output line.

Furthermore, in a configuration described in Japanese Patent Laid-Open No. 2006-246450, it is possible to transfer some of charges generated by a photoelectric conversion portion to a charge holding portion during part of an exposure period.

In general, a charge hold portion is covered by a light-shielding member, thereby preventing extraneous light from entering. Since, however, it is difficult to completely prevent extraneous light from entering, some light leaking from the light-shielding member may enter the charge holding portion. In this case, charges are generated within the charge holding portion due to the leakage light. These charges are noise charges different from signal charges generated by a photoelectric conversion portion during an accumulation period. These noise charges vary depending on the time during which the leakage light is incident on the charge holding portion and the intensity of the light, and appear as shading or an afterimage in an output image, thereby causing deterioration in image quality.

The configurations described in Japanese Patent Laid-Open Nos. 2004-111590 and 2006-246450, however, do not consider reducing the leakage light into the charge holding portion.

SUMMARY OF THE INVENTION

The present invention has been made in consideration of the aforementioned problem, and reduces leakage of light into a charge holding portion in an image sensor including a charge holding portion for each pixel.

According to the first aspect of the present invention, there is provided a solid-state image sensor including an effective pixel area in which a plurality of pixels are two-dimensionally arranged, each of the plurality of pixels comprising a photoelectric conversion portion configured to generate charges by photoelectric conversion, a charge holding portion configured to hold the charges generated by the photoelectric conversion portion, a floating diffusion portion configured to convert the charges from the charge holding portion into a voltage, a first transfer portion configured to transfer the charges of the photoelectric conversion portion to the charge holding portion, and a second transfer portion configured to transfer the charges of the charge holding portion to the floating diffusion portion, wherein the charge holding portion of each of the plurality of pixels is arranged on the inner side of the photoelectric conversion portion with respect to the center of the effective pixel area.

According to the second aspect of the present invention, there is provided an image pickup apparatus comprising: a solid-state image sensor defined above; and a correction unit configured to correct a difference in characteristic between a plurality of areas of an effective pixel area of the solid-state image sensor, which are symmetrical to each other with respect to the center of the effective pixel area.

Further features of the present invention will become apparent from the following description of exemplary embodiments with reference to the attached drawings.

DESCRIPTION OF THE EMBODIMENTS

Embodiments of the present invention will be described in detail below with reference to the accompanying drawings.

(First Embodiment)

Figure 1:
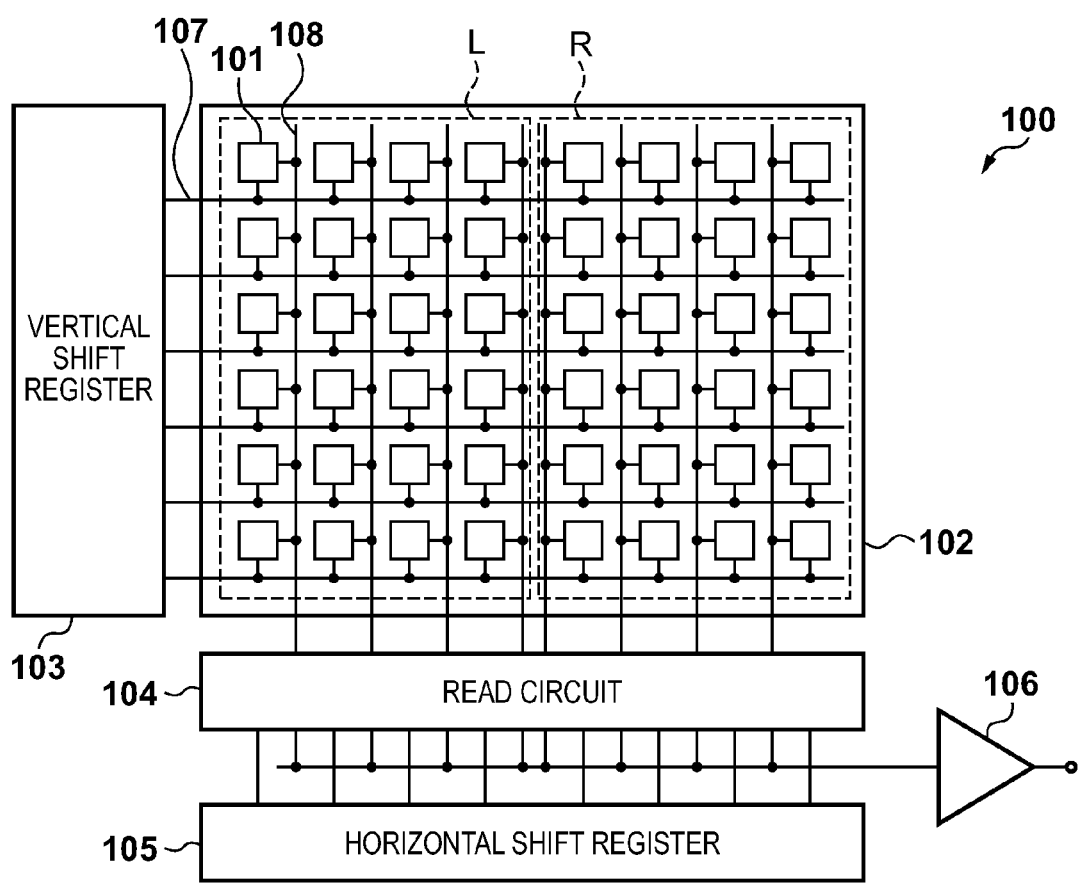
FIG. 1 is a circuit diagram showing the schematic configuration of a solid-state image sensor according to the first embodiment.

FIG. 1 is a circuit diagram showing the schematic configuration of a solid-state image sensor 100 according to the first embodiment of the present invention. As shown in FIG. 1, the solid-state image sensor 100 is a CMOS solid-state image sensor, and includes a pixel area 102 in which a plurality of unit pixels 101 are arranged in a matrix topology (two-dimensionally arranged), and its peripheral circuits. The pixel area 102 is divided into areas L and R, as shown in FIG. 1. Between the areas L and R, the circuit operations of the respective pixels are the same but the positions of circuit elements arranged within the respective pixels are different from each other. A detailed description thereof will be provided later.

The peripheral circuits include a vertical shift register 103, a read circuit 104, a horizontal shift register 105, an output amplifier 106, driving signal lines 107, and vertical signal lines 108. The vertical shift register 103 sends a driving pulse via the driving signal line 107 for each pixel on each row. Note that one driving signal line 107 is provided for each row in FIG. 1 for the sake of simplicity but a plurality of driving signal lines are actually connected for each row. Furthermore, pixels on the same column are connected to one vertical signal line 108. Pixel signals on a row selected by the vertical shift register are output to the read circuit 104 via the vertical signal line 108, and pixel signals selected by the horizontal shift register 105 are sequentially output via the output amplifier 106.

Referring to FIG. 1, each pixel of the area L is connected to the vertical signal line arranged on the right side for each column, and each pixel of the area R is connected to the vertical signal line arranged on the left side for each column. The present invention, however, is not limited to this. For example, each pixel of both the areas L and R may be connected to the vertical signal line arranged on the same side, that is, the right or left side, for each column.

Figure 2:
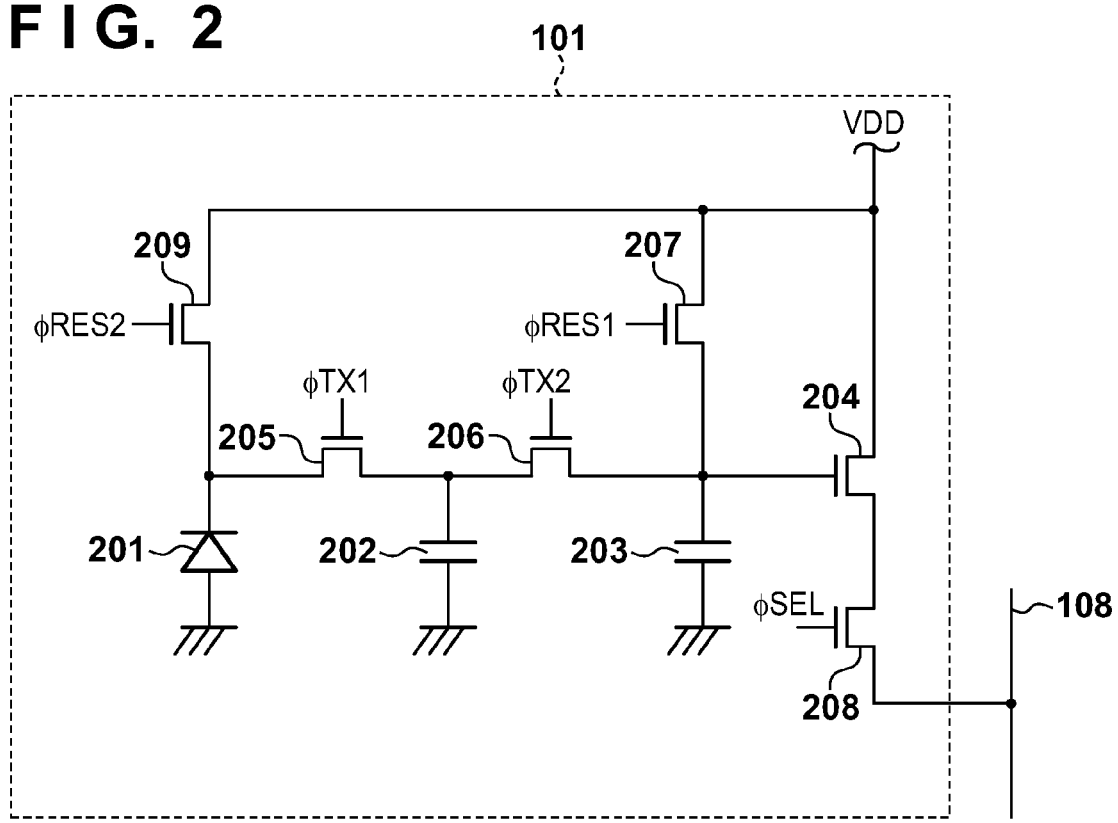
FIG. 2 is a circuit diagram showing a unit pixel according to the first embodiment.

FIG. 2 is a circuit diagram showing the unit pixel 101 of the solid-state image sensor 100 shown in FIG. 1. Note that between the areas L and R, the circuit operations of the unit pixels are the same but the positions of the circuit elements arranged within the respective pixels are different from each other.

As shown in FIG. 2, the unit pixel 101 includes a photodiode 201, a charge holding portion 202, a floating diffusion portion 203, an amplifier 204, a first transfer switch 205, a second transfer switch 206, a first reset switch 207, a second reset switch 209, and a selection switch 208.

The photodiode 201 functions as a photoelectric conversion portion which receives light incident on the unit pixel 101, and generates signal charges corresponding to the amount of the received light. The charge holding portion 202 accumulates the charges generated by the photodiode 201. The floating diffusion portion 203 temporarily holds the charges transferred from the charge holding portion 202, and also functions as a charge/voltage conversion portion which converts the held charges into a voltage signal. The amplifier 204 serves as a source follower MOS transistor, which amplifies the voltage signal based on the charges held in the floating diffusion portion 203, and outputs it as a pixel signal.

The first transfer switch 205 is driven by a transfer pulse signal φTX1, and transfers the signal charges generated by the photodiode 201 to the charge holding portion 202. The second transfer switch 206 is driven by a transfer pulse signal φTX2, and transfers the signal charges held in the charge holding portion 202 to the floating diffusion portion 203.

The reset switch 207 is driven by a reset pulse signal φRES1, and resets the potential of the floating diffusion portion 203 to a reference potential VDD. At this time, it is possible to reset the charge holding portion 202 by turning on the first transfer switch 205 together with the reset switch 207. The reset switch 209 is driven by a reset pulse signal φRES2, and resets the potential of the photodiode 201 to the reference potential VDD. At this time, it is possible to reset the charge holding portion 202 by turning on the second transfer switch 206 together with the reset switch 209.

The selection switch 208 is driven by a vertical selection pulse signal φSEL, and outputs the pixel signal amplified by the amplifier 204 to the vertical signal line 108.

The circuit operation of the solid-state image sensor 100 having the above-described circuit configuration is well known, and a description thereof will be omitted.

Figure 3:
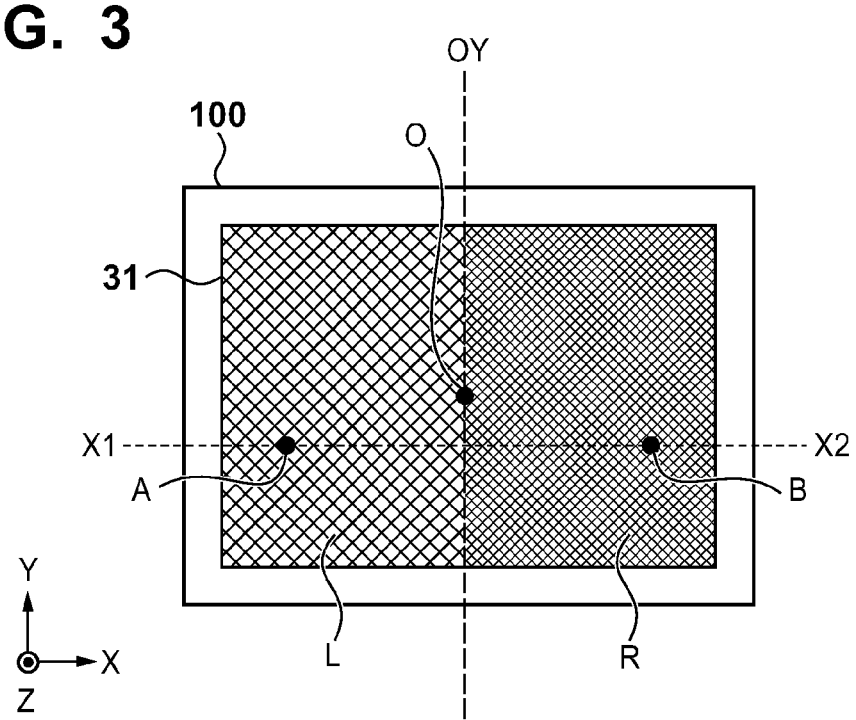
FIG. 3 is a schematic plan view showing the solid-state image sensor according to the first embodiment.

FIG. 3 is a schematic plan view showing the solid-state image sensor 100 shown in FIG. 1. Note that for descriptive convenience, the X-, Y-, and Z-axes that are orthogonal to each other are defined, as shown in FIG. 3. The X-axis direction indicates the row direction of a pixel arrangement, and the Y-axis direction indicates the column direction of the pixel arrangement.

Referring to FIG. 3, an imaging lens (not shown) for forming an object image on an effective pixel area 31 is arranged so that its optical axis passes through the center O (optical axis) of the effective pixel area. A plane OY (first plane) passes through the center O of the effective pixel area, and is parallel to the Y-Z plane.

In this embodiment, in the pixel area L on the left side of the plane OY passing through the center O of the effective pixel area, the charge holding portion of each pixel is arranged on the right side of the photodiode. In the right pixel area R, the charge holding portion of each pixel is arranged on the left side of the photodiode. That is, the charge holding portion of each pixel is arranged on the inner side of the photodiode with respect to the plane OY.

Figure 4:
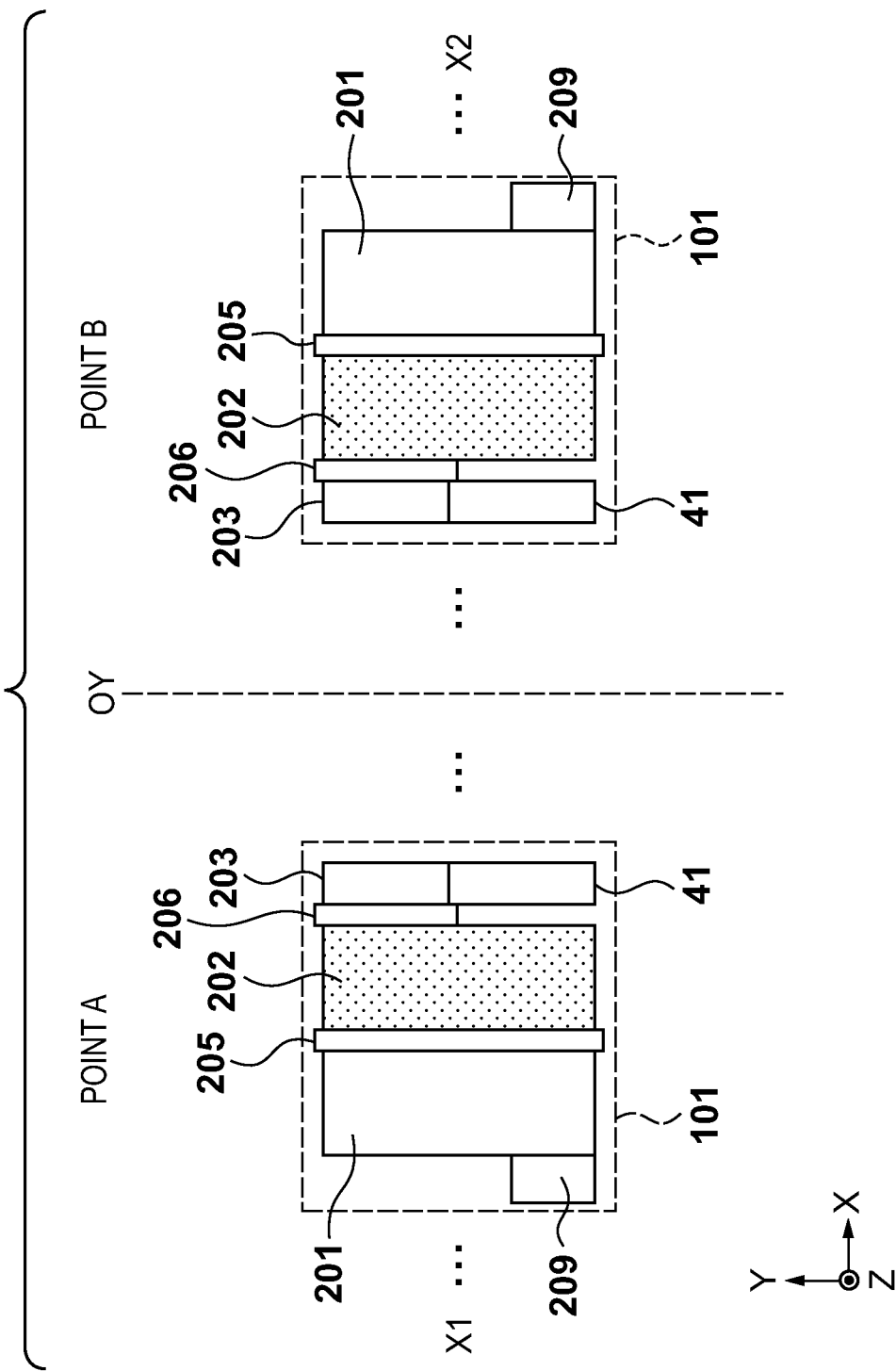
FIG. 4 is a schematic plan view showing two unit pixels according to the first embodiment.

FIG. 4 is a schematic plan view showing two unit pixels along a line X1-X2 shown in FIG. 3. More specifically, FIG. 4 shows two unit pixels 101 positioned at points A (on one side of the plane OY) and B (on the other side of the plane OY) shown in FIG. 3. Furthermore, FIG. 4 shows the arrangement of the photodiode 201, charge holding portion 202, floating diffusion portion 203, transfer switches 205 and 206, and second reset switch 209 within the unit pixel 101. In an area 41 shown in FIG. 4, the amplifier 204, reset switch 207, selection switch 208, and the like are arranged. As shown in FIG. 4, the charge holding portion 202 of the unit pixel at the point A within the area L is arranged on the right side of the photodiode 201 of this pixel, and the charge holding portion 202 of the unit pixel at the point B within the area R is arranged on the left side of the photodiode 201 of this pixel.

Figure 5:
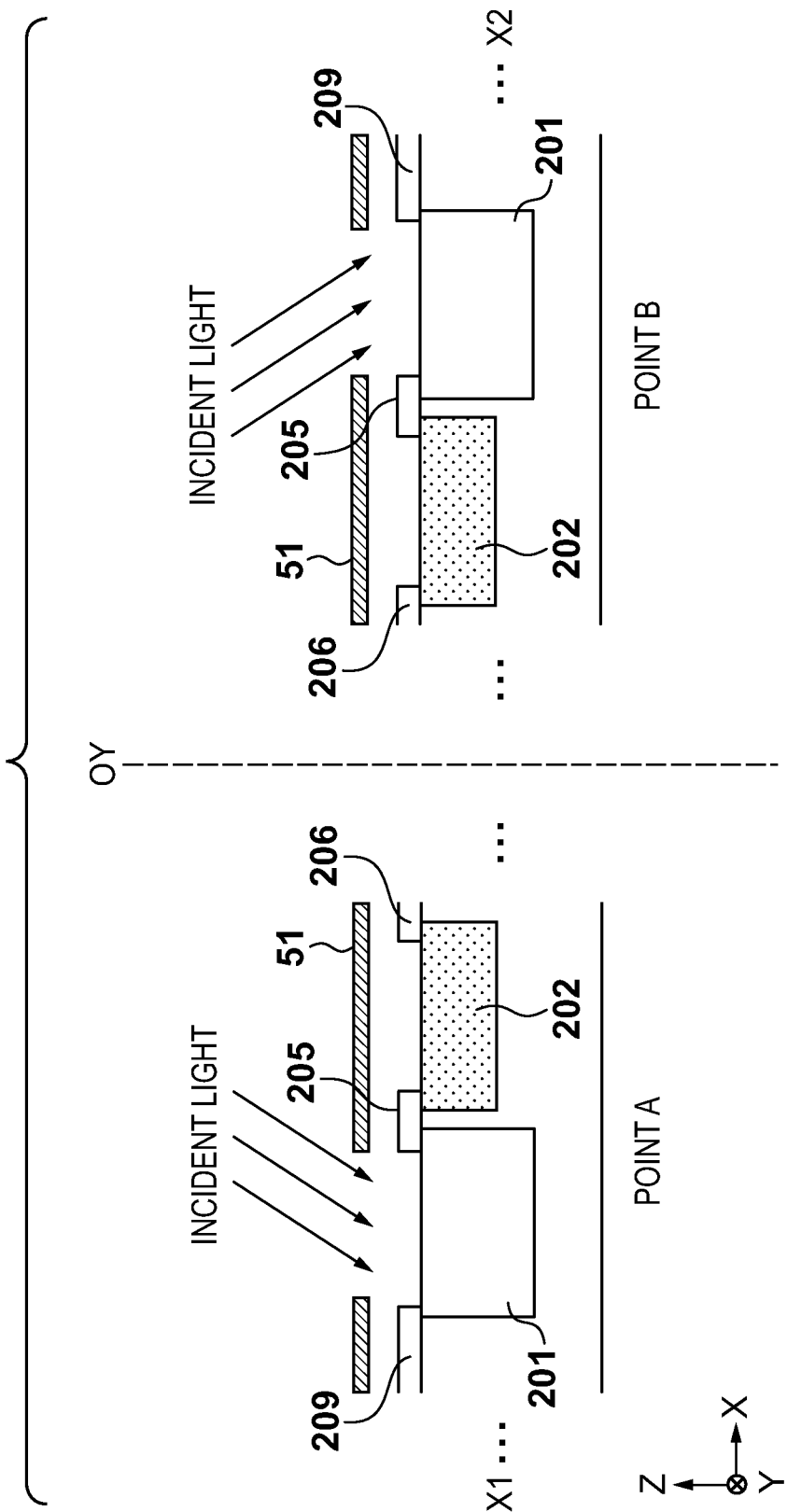
FIG. 5 is a schematic sectional view showing the two unit pixels according to the first embodiment.

FIG. 5 is a schematic sectional view showing the two unit pixels along the line X1-X2 shown in FIG. 3. More specifically, FIG. 5 shows the two unit pixels positioned at the points A and B shown in FIG. 3. Furthermore, FIG. 5 shows the arrangement of the photodiode 201, charge holding portion 202, transfer switches 205 and 206, and second reset switch 209 of each unit pixel, and other parts are omitted. A light-shielding member 51 is provided above the charge holding portion 202.

On a substrate on which the photodiode, the charge holding portion, and the like are arranged, a plurality of wiring layers are arranged via an interlayer dielectric film, and form an opening to surround each pixel, which are not shown in FIG. 5. A color filter, a microlens, and the like are arranged on the wiring layers but are not shown in FIG. 5.

FIG. 5 also shows light incident on each pixel. When light enters a pixel near the center of the effective pixel area, it vertically enters toward almost the center of the photodiode 201. On the other hand, when light enters a pixel positioned near the edge of the effective pixel area, it obliquely enters in a direction shifted to the outer side of the photodiode with respect to the center of the effective pixel area. The obliquely incident light becomes more significant as the aperture value of the imaging lens for forming an object image draws near the maximum value.

As shown in FIG. 5, light is obliquely incident from the right side on the photodiode 201 of the pixel at the point A near the left edge of the effective pixel area. Light is obliquely incident from the left side on the photodiode 201 of the pixel at the point B near the right edge of the effective pixel area.

In this embodiment, the charge holding portion 202 of the pixel at the point A on which light is obliquely incident from the right side is arranged on the right side of the photodiode 201 within this pixel. This arrangement can reduce light which is obliquely incident from the right side and leaks from the interstices of the light-shielding member into the charge holding portion. On the other hand, the charge holding portion 202 of the pixel at the point B on which light is obliquely incident from the left side is arranged on the left side of the photodiode 201 within this pixel. This arrangement can reduce light which is obliquely incident from the left side and leaks from the interstices of the light-shielding member into the charge holding portion.

Figure 6:
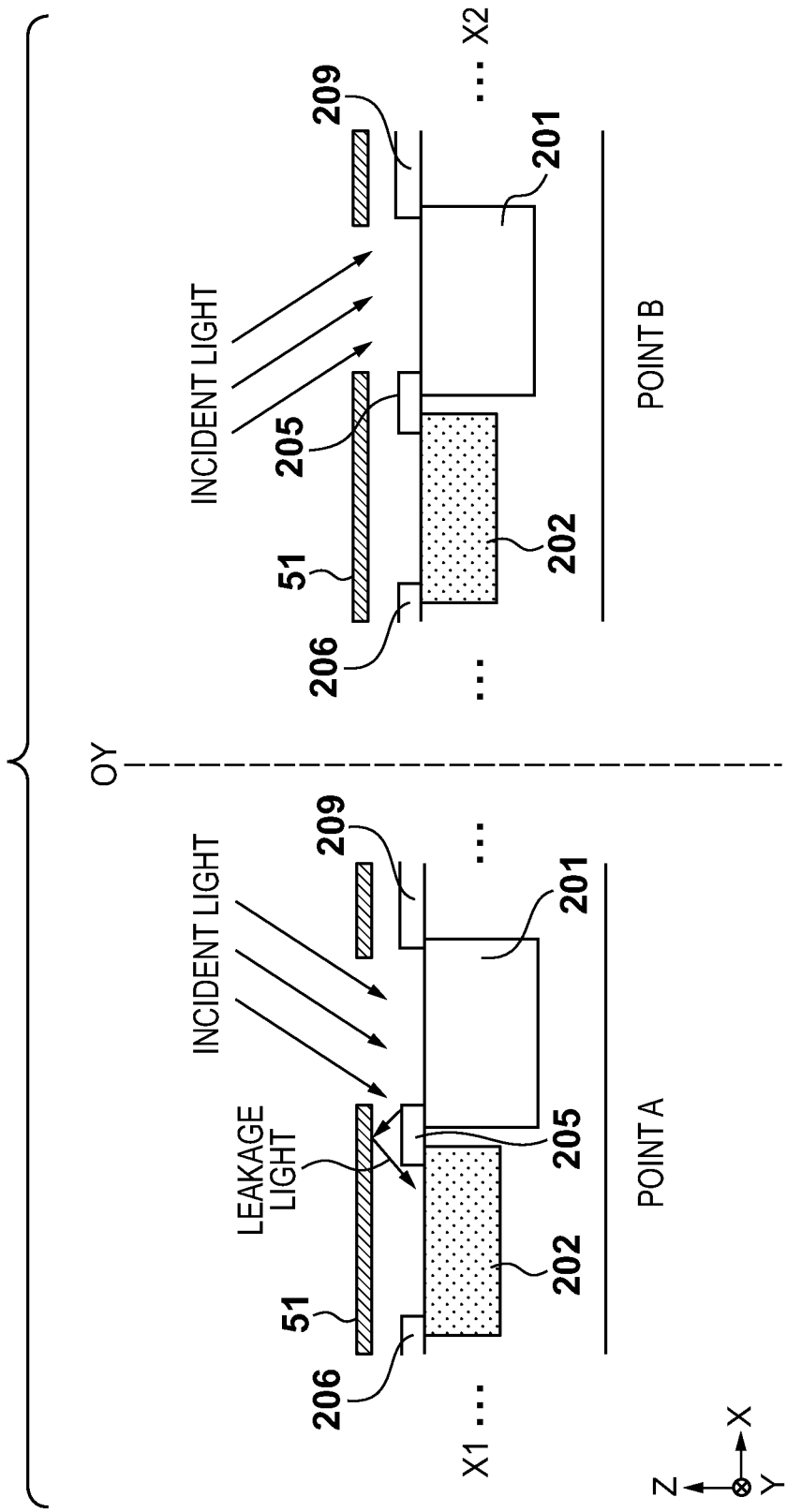
FIG. 6 is a schematic sectional view showing two unit pixels of a solid-state image sensor according to a Comparative Example.

FIG. 6 is a schematic sectional view showing a solid-state image sensor according to a Comparative Example to be compared with the solid-state image sensor 100 according to this embodiment. FIG. 6 corresponds to FIG. 5. In the solid-state image sensor according to the comparative example, as shown in FIG. 6, both the charge holding portion of a unit pixel at a point A in an area L and that of a unit pixel at a point B in an area R are arranged on the left sides of corresponding photodiodes. In this case, the charge holding portion of the pixel at the point B is arranged on the inner side of the photodiode with respect to the center of an effective pixel area, while the charge holding portion of the pixel at the point A is arranged on the outer side of the photodiode. Light obliquely incident from the right side enters the pixel at the point A from the interstices of the light-shielding member 51, and is reflected by the internal surface of the light-shielding member 51 and the like to leak into the charge holding portion. As a result, noise charges are generated in the charge holding portion due to the leakage light, thereby deteriorating the image quality of a captured image.

To the contrary, in both the areas L and R of the solid-state image sensor according to the embodiment, the charge holding portion of each pixel is arranged on the inner side of the photodiode with respect to the center of the effective pixel area. It is, therefore, possible to reduce leakage of obliquely incident light into the charge holding portions in the whole range of the effective pixel area.

Note that in practice, a very small part of light incident on a neighboring pixel leaks into the charge holding portion. For example, light incident on the right neighboring pixel (not shown) of the pixel at the point A in FIG. 5 may leak into the charge holding portion 202 at the point A. However, a plurality of wiring layers shield the gaps between the pixels from light, and the distance from the charge holding portion of the pixel of interest to the opening of the neighboring pixel is longer than that from the charge holding portion to the opening within the pixel of interest. The amount of leakage light from the neighboring pixel, therefore, is sufficiently smaller than that of the leakage light from the opening within the same pixel. With the configuration according to this embodiment in which leakage light from the opening to the charge holding portion within the same pixel is suppressed, it is possible to effectively suppress generation of noise charges due to leakage light.

Figure 7:
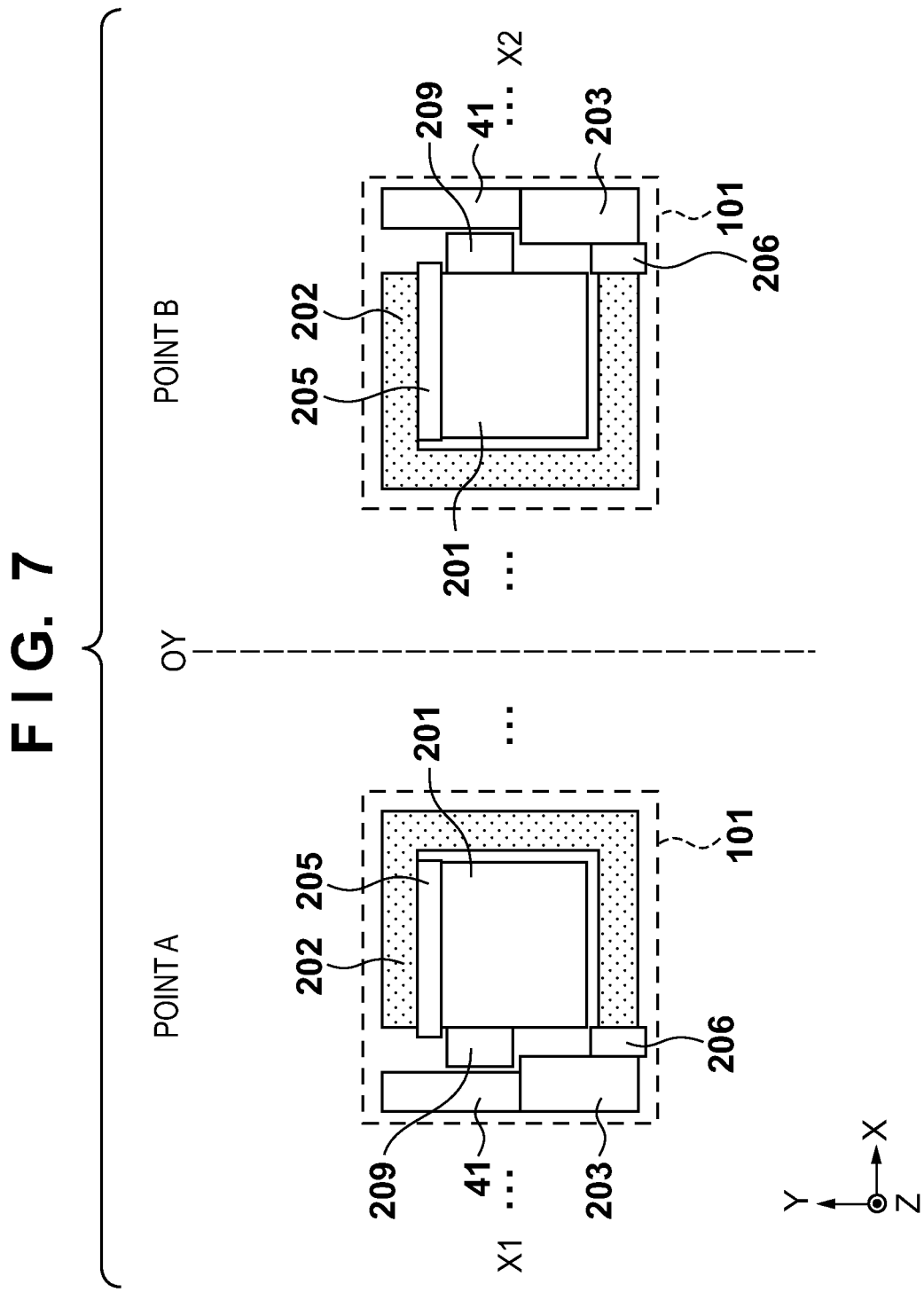
FIG. 7 is a schematic plan view showing two unit pixels of a solid-state image sensor according to a modification of the first embodiment.

FIG. 7 is a schematic plan view showing two unit pixels of a solid-state image sensor according to a modification of the solid-state image sensor 100 according to the embodiment. FIG. 7 corresponds to FIG. 4. The same reference numerals as in FIG. 3 denote the same or corresponding constituent elements in FIG. 7, and a repetitive description thereof will be omitted.

As shown in FIG. 7, the charge holding portion 202 of the unit pixel at the point A within the area L shown in FIG. 3 has a U shape open to the left, and is arranged on the right side of the photodiode 201. The charge holding portion 202 of the unit pixel at the point B within the area R has a U shape open to the right, and is arranged on the left side of the photodiode 201. That is, the charge holding portion is arranged on the inner side of the photodiode with respect to the plane OY passing through the center. It is, therefore, possible to reduce leakage of obliquely incident light into the charge holding portion.

Furthermore, as shown in FIG. 7, when the charge holding portion has a U shape, the photodiode can be arranged near the center of the unit pixel 101. It is thus possible to arrange the photodiodes at regular intervals even in pixels positioned at the boundary between the areas L and R.

Note that the solid-state image sensor according to this embodiment has the configuration in which each charge holding portion is arranged on the inner side of a corresponding photodiode in both the left and right pixel areas with respect to the plane OY passing through the center O, as shown in FIG. 3. The solid-state image sensor may have a configuration in which the X- and Y-axis directions are reversed. That is, in the upper and lower pixel areas divided by a plane which passes through the center O and is parallel to the Z-X plane in FIG. 3, each charge holding portion may be arranged on the inner side of a corresponding photodiode.

(Second Embodiment)

Figure 8:
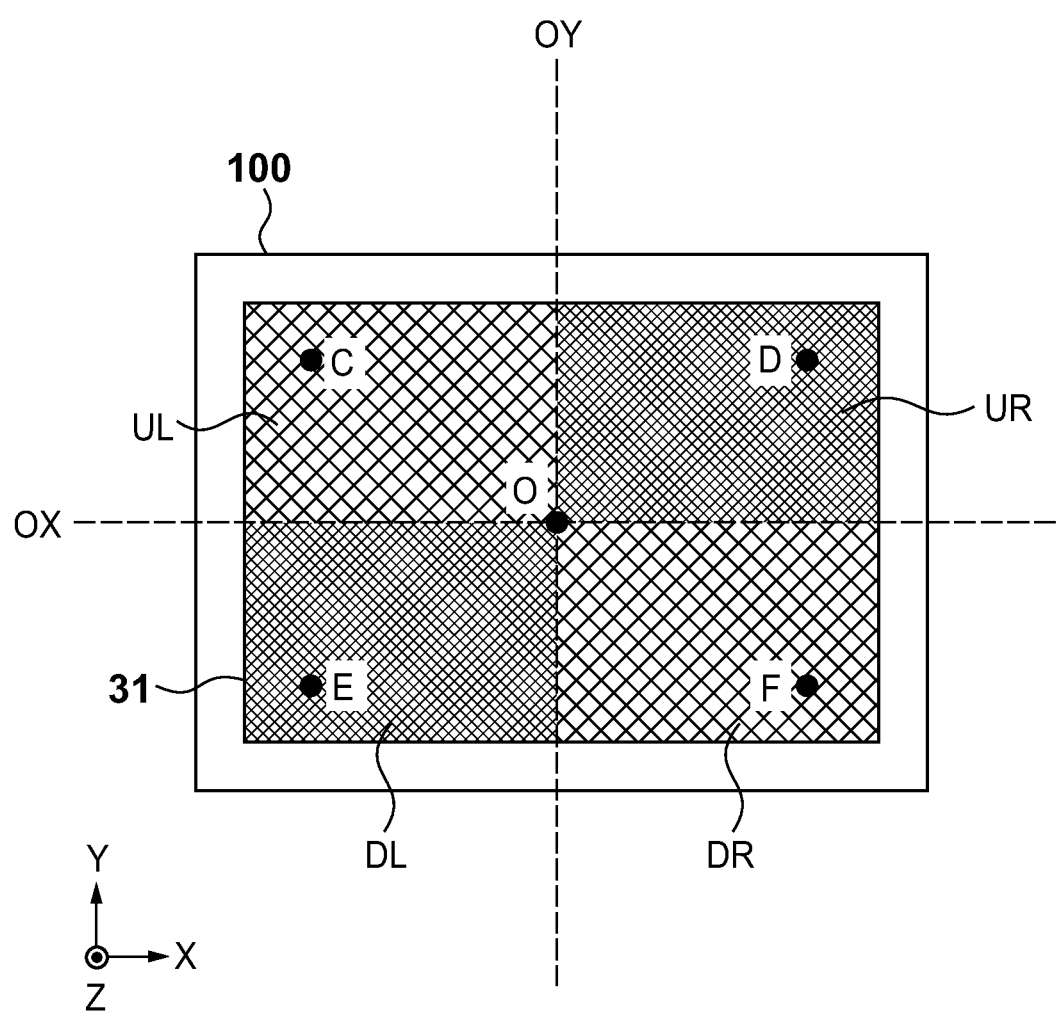
FIG. 8 is a schematic plan view showing a solid-state image sensor according to the second embodiment.

FIG. 8 is a schematic plan view showing a solid-state image sensor 100 according to the second embodiment of the present invention. FIG. 8 corresponds to FIG. 3 in the first embodiment. The same reference numerals as in FIG. 3 denote the same or corresponding constituent elements, and a repetitive description thereof will be omitted. Referring to FIG. 8, a plane OX (second plane) passes through a center O, and is parallel to the Z-X plane. Four pixel areas divided by the planes OY and OX are defined as an upper left pixel area UL, an upper right pixel area UR, a lower left pixel area DL, and a lower right pixel area DR.

Figure 9:
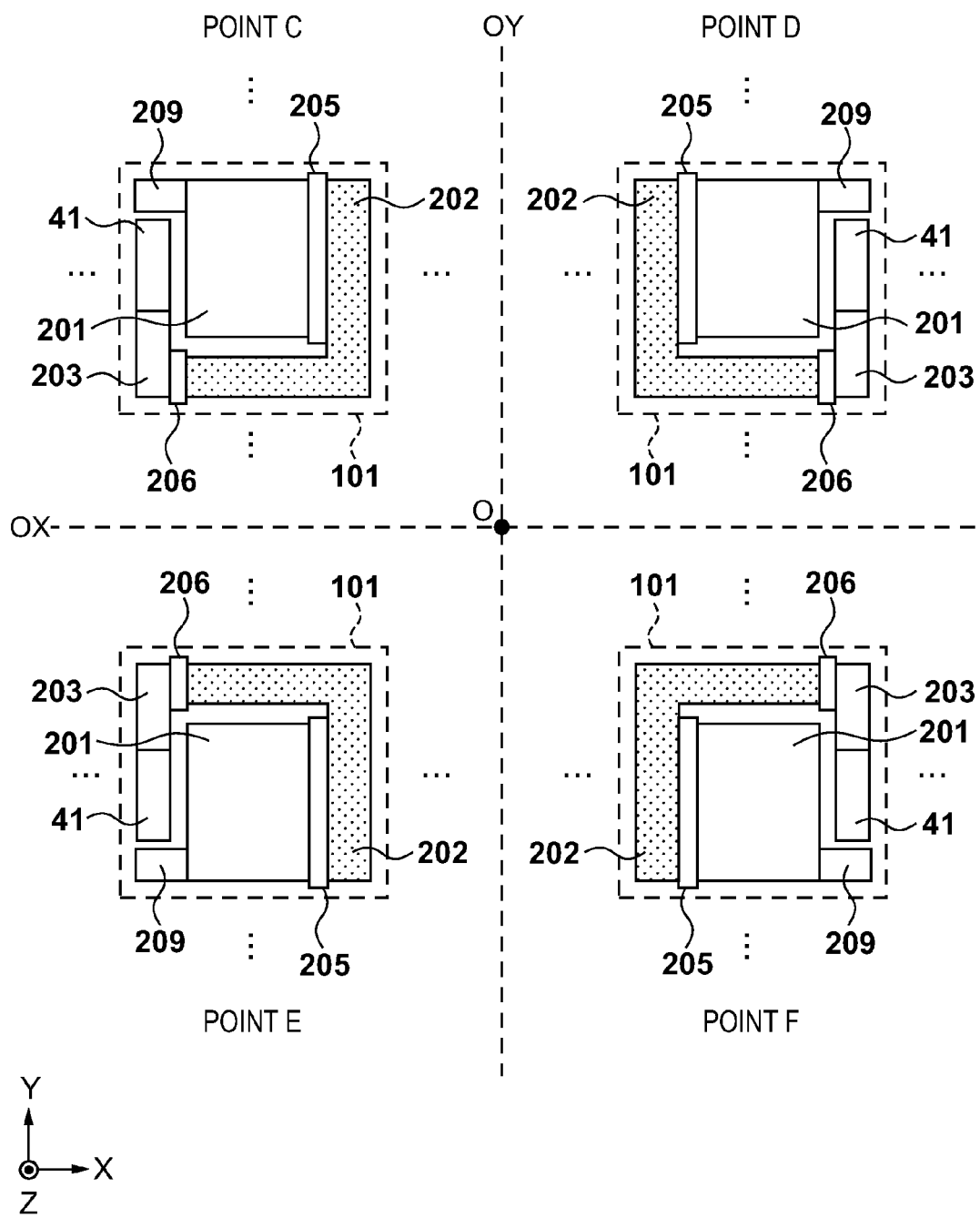
FIG. 9 is a schematic plan view showing four unit pixels according to the second embodiment.

FIG. 9 is a schematic plan view showing unit pixels at points C, D, E, and F in the respective pixel areas UL, UR, DL, and DR shown in FIG. 8. FIG. 9 corresponds to FIGS. 4 and 7. The same reference numerals as in FIGS. 4 and 7 denote the same or corresponding constituent elements, and a repetitive description thereof will be omitted.

In the solid-state image sensor according to the embodiment, a charge holding portion 202 of each pixel has an L shape. The charge holding portion 202 at the point C in the area UL is arranged at a lower right position with respect to a photodiode 201, and the charge holding portion 202 at the point D in the area UR is arranged at a lower left position with respect to a photodiode 201. Furthermore, the charge holding portion 202 at the point E in the area DL is arranged at an upper right position with respect to a photodiode 201, and the charge holding portion 202 at the point F in the area DR is arranged at an upper left position with respect to a photodiode 201.

In the first embodiment, the charge holding portion is arranged on the inner side of the photodiode with respect to the plane OY. On the other hand, in the second embodiment, the charge holding portion is arranged on the inner side of the photodiode with respect to the plane OX in addition to the plane OY. It is, therefore, possible to reduce not only leakage of light obliquely incident from the X-axis direction into the charge holding portion but also leakage of light obliquely incident from the Y-axis direction into the charge holding portion.

Note that in the first and second embodiments, the center O need not be exactly the center position of the effective pixel area, and may be any position on the optical axis of the imaging lens.

(Third Embodiment)

The third embodiment in which the solid-state image sensor according to the first and second embodiments is applied to an image pickup apparatus (more specifically, a digital camera) will be described.

In the structure of the solid-state image sensor shown in FIG. 4 according to the first embodiment, the directions of the transfer switches 205 and 206 are reversed between the areas L and R which are symmetrical to each other with respect to the center of the effective pixel area. In the structure shown in FIG. 7 as the modification of the first embodiment, the direction of the transfer switch 206 is reversed between the areas L and R. In this case, in the manufacturing process of the solid-state image sensor, when a photodiode or the charge accumulation layer of the charge holding portion is formed under each transfer gate using an oblique ion implantation method as a well-known technique, the direction of oblique ion implantation is different between the areas L and R. It is thus necessary to individually perform oblique ion implantation processing for each pixel area. In this case, a difference in characteristic of the transfer switch may occur between the areas L and R due to variations in oblique ion implantation processing.

In the structure of the solid-state image sensor shown in FIG. 4, the arrangement position of the floating diffusion portion 203 is different between the areas L and R. A small difference in capacitive coupling between the floating diffusion portion and surrounding wirings may therefore occur between the areas L and R.

A difference in characteristic between the areas L and R causes an offset and gain shift between the areas L and R, which may appear as a step in output. In this embodiment, therefore, a configuration in which signal processing by a digital camera corrects an offset and gain shift between the areas L and R.

Figure 10:
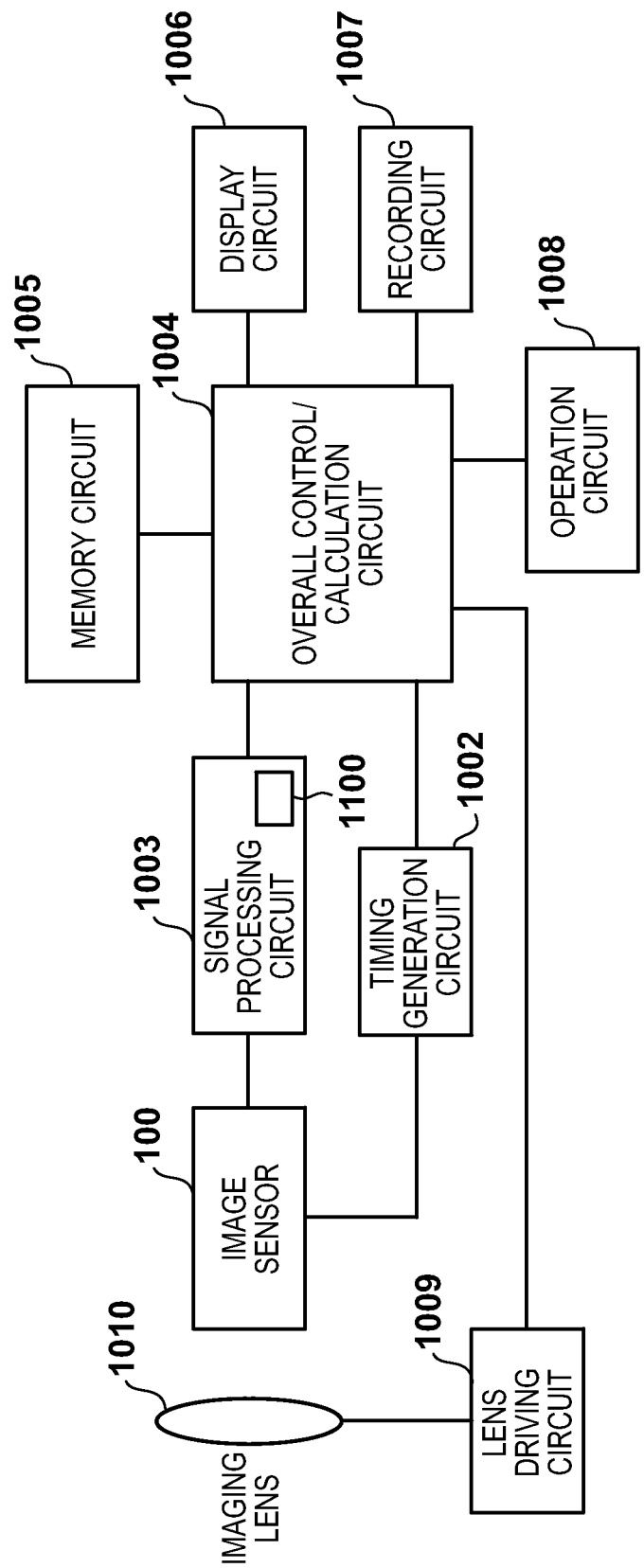
FIG. 10 is a block diagram showing the overall configuration of an image pickup apparatus according to the third embodiment of the present invention.

FIG. 10 is a block diagram showing the overall configuration of an image pickup apparatus according to the third embodiment of the present invention. An imaging lens 1010 serves as an optical system for forming an optical image of an object on an image sensor 100, and a lens driving circuit 1009 performs zoom control, focus control, aperture stop control, and the like. The image sensor 100 is used to take an image, as an image signal, the object image formed by the imaging lens 1010, and has the configuration shown in FIGS. 1 to 5 of the first embodiment. A signal processing circuit 1003 performs various correction processes for the image signal output from the image sensor 100, and compresses data. The signal processing circuit 1003 includes a correction unit 1100 for correcting an offset and gain shift between the areas L and R for the image signal obtained by the image sensor 100. A timing generation circuit 1002 outputs a driving timing signal to the image sensor 100. An overall control/calculation circuit 1004 controls the whole image pickup apparatus while executing various calculations. A memory circuit 1005 temporarily stores image data. A display circuit 1006 displays various kinds of information and captured images. A recording circuit 1007 is a detachable recording circuit such as a semiconductor memory for recording or reading out image data. An operation circuit 1008 electrically accepts an operation on the operation member of the digital camera.

Figure 11:
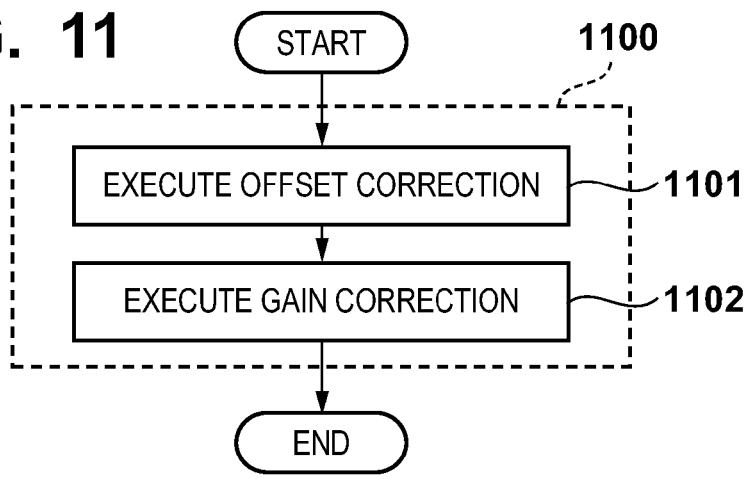
FIG. 11 is a flowchart for explaining processing of correcting an offset and gain shift between areas L and R, which is executed by a correction unit.

FIG. 11 is a flowchart for explaining processing of correcting an offset and gain shift between the areas L and R, which is executed by the correction unit 1100 within the signal processing circuit 1003.

Figure 12A:
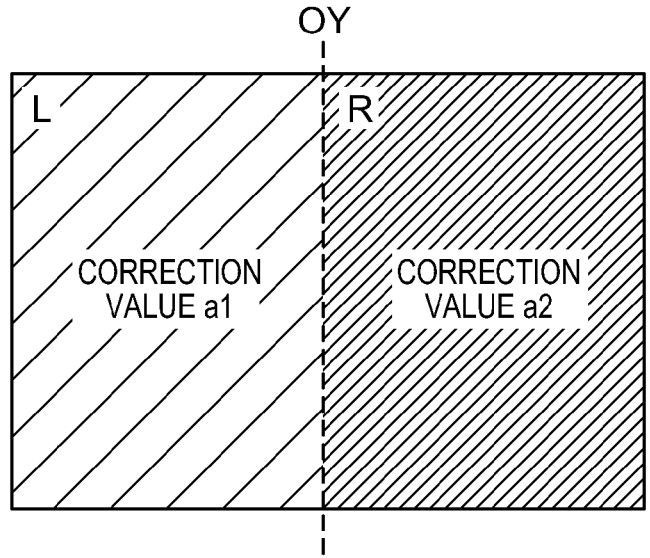
FIGS. 12A and 12B are views showing offset correction values and gain correction values.

In step S1101, offset correction is executed for an image input to the correction unit 1100. A value shown in FIG. 12A is used as an offset correction value for each pixel signal. FIG. 12A shows offset correction values corresponding to the pixel areas shown in FIG. 3. That is, the output signal of a pixel in the area L undergoes offset correction using a correction value a1, and the output signal of a pixel in the area R undergoes offset correction using a correction value a2.

Figure 12B:
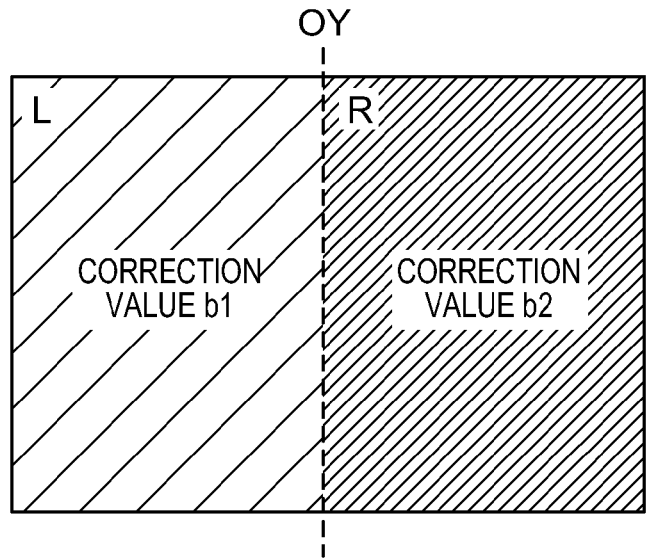

In step S1102, gain correction is executed for the image having undergone offset correction. A value shown in FIG. 12B is used as a gain correction value for each pixel signal. That is, the output signal of a pixel in the area L undergoes gain correction using a correction value b1, and the output signal of a pixel in the area R undergoes gain correction using a correction value b2.

The above-described correction processing can correct an offset and gain shift between the areas L and R.

As a method of calculating the correction values shown in FIGS. 12A and 12B, for example, it is only necessary to take a light-shielded image and an image of a uniform luminance surface during factory adjustment of the digital camera, and then decide offset correction values and gain correction values so that outputs become equal to each other near the boundary between the areas L and R.

Note that in this embodiment, the correction unit 1100 of the signal processing circuit 1003 executes correction processing. However, the correction unit 1100 of the overall control/calculation circuit 1004 may execute correction processing. The correction processing of the correction unit 1100 may be performed simultaneously with processing of correcting an offset or gain shift for each column of the read circuit 104.

Furthermore, the offset correction values and gain correction values of the areas L and R may be changed depending on image pickup conditions such as the ISO sensitivity, exposure time, and temperature.

In this embodiment, there has been described the configuration for correcting an output step between the areas L and R of the image sensor which are obtained by dividing the pixel area, as shown in the first embodiment. If, however, the pixel area is divided into the four areas UL, UR, DL, and DR as shown in FIG. 8 of the second embodiment, correction values need only be provided for each of the areas UL, UR, DL, and DR.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-147594, filed Jun. 29, 2012, and 2013-086062, filed Apr. 16, 2013, which are hereby incorporated by reference herein in their entirety.

What is claimed is:

1. A solid-state image sensor including an effective pixel area in which a plurality of pixels are two-dimensionally arranged, each of the plurality of pixels comprising
a photoelectric conversion portion configured to generate charges by photoelectric conversion,
a charge holding portion configured to hold the charges generated by said photoelectric conversion portion, a floating diffusion portion configured to convert the charges from said charge holding portion into a voltage,
a first transfer portion configured to transfer the charges of said photoelectric conversion portion to said charge holding portion, and
a second transfer portion configured to transfer the charges of said charge holding portion to said floating diffusion portion,
wherein said floating diffusion portion of each of the plurality of pixels is arranged on the inner side of said charge holding portion with respect to the center of the effective pixel area so that the floating diffusion portion is positioned closer to the center of the effective pixel area than the charge holding portion.

2. The sensor according to claim 1, wherein said charge holding portion of each of the plurality of pixels is arranged on the inner side of said photoelectric conversion portion with respect to the center of the effective pixel area.

3. The sensor according to claim 2, wherein with respect to a first plane which is perpendicular to a surface of the effective pixel area and passes through the center of the effective pixel area, an arrangement position of said charge holding portion relative to said photoelectric conversion portion in each pixel is different between one side area and the other side area of the effective pixel area with respect to the first plane.

4. The sensor according to claim 3, wherein with respect to a second plane which is perpendicular to the surface of the effective pixel area, passes through the center of the effective pixel area, and is perpendicular to the first plane, an arrangement position of said charge holding portion relative to said photoelectric conversion portion in each pixel is different between one side area and the other side area of the effective pixel area with respect to the second plane.

5. The sensor according to claim 1, wherein the center of the effective pixel area is on an optical axis of an imaging lens for forming an object image on the effective pixel area.

6. The sensor according to claim 1, wherein with respect to a first plane which is perpendicular to a surface of the effective pixel area and passes through the center of the effective pixel area, an arrangement position of said floating diffusion portion relative to said charge holding portion in each pixel is different between one side area and the other side area of the effective pixel area with respect to the first plane.

7. A solid-state image sensor including an effective pixel area in which a plurality of pixels are two-dimensionally arranged,
each of the plurality of pixels comprising
a photoelectric conversion portion configured to generate charges by photoelectric conversion,
a charge holding portion configured to hold the charges generated by said photoelectric conversion portion,
a floating diffusion portion configured to convert the charges from said charge holding portion into a voltage,
a first transfer portion configured to transfer the charges of said photoelectric conversion portion to said charge holding portion, and
a second transfer portion configured to transfer the charges of said charge holding portion to said floating diffusion portion,
wherein said charge holding portion has a U shape on the surface of the effective pixel area, and an orientation of the U shape is different between one side area and the other side area of the effective pixel area with respect to a first plane which is perpendicular to a surface of the effective pixel area and passes through the center of the effective pixel area.

8. The sensor according to claim 7, wherein the center of the effective pixel area is on an optical axis of an imaging lens for forming an object image on the effective pixel area.

9. A solid-state image sensor including an effective pixel area in which a plurality of pixels are two-dimensionally arranged,
each of the plurality of pixels comprising
a photoelectric conversion portion configured to generate charges by photoelectric conversion,
a charge holding portion configured to hold the charges generated by said photoelectric conversion portion,
a floating diffusion portion configured to convert the charges from said charge holding portion into a voltage,
a first transfer portion configured to transfer the charges of said photoelectric conversion portion to said charge holding portion, and
a second transfer portion configured to transfer the charges of said charge holding portion to said floating diffusion portion,
wherein said charge holding portion has an L shape on the surface of the effective pixel area, and an orientation of the L shape is different in each of four areas obtained by dividing the effective pixel area by a first plane which is perpendicular to a surface of the effective pixel area and passes through the center of the effective pixel area and a second plane which is perpendicular to the surface of the effective pixel area, passes through the center of the effective pixel area, and is perpendicular to the first plane.

10. The sensor according to claim 9, wherein the center of the effective pixel area is on an optical axis of an imaging lens for forming an object image on the effective pixel area.

11. An image pickup apparatus comprising:
a solid-state image sensor including an effective pixel area in which a plurality of pixels are two-dimensionally arranged, each of the plurality of pixels comprising a photoelectric conversion portion configured to generate charges by photoelectric conversion, a charge holding portion configured to hold the charges generated by said photoelectric conversion portion, a floating diffusion portion configured to convert the charges from said charge holding portion into a voltage, a first transfer portion configured to transfer the charges of said photoelectric conversion portion to said charge holding portion, and a second transfer portion configured to transfer the charges of said charge holding portion to said floating diffusion portion, wherein said charge holding portion of each of the plurality of pixels is arranged on the inner side of said photoelectric conversion portion with respect to the center of the effective pixel area; and
a correction unit configured to correct a difference in characteristic between a plurality of areas of an effective pixel area of said solid-state image sensor, which are symmetrical to each other with respect to the center of the effective pixel area.

12. The apparatus according to claim 11, wherein in said solid-state image sensor, with respect to a first plane which is perpendicular to a surface of the effective pixel area and passes through the center of the effective pixel area, an arrangement position of said charge holding portion relative to said photoelectric conversion portion in each pixel is different between one side area and the other side area of the effective pixel area with respect to the first plane.

13. The apparatus according to claim 12, wherein in said solid-state image sensor, with respect to a second plane which is perpendicular to the surface of the effective pixel area, passes through the center of the effective pixel area, and is perpendicular to the first plane, an arrangement position of said charge holding portion relative to said photoelectric conversion portion in each pixel is different between one side area and the other side area of the effective pixel area with respect to the second plane.

14. The apparatus according to claim 11, wherein in said solid-state image sensor, the center of the effective pixel area is on an optical axis of an imaging lens for forming an object image on the effective pixel area.

* * * * *